United States Patent
Li et al.

(10) Patent No.: US 7,936,622 B2
(45) Date of Patent: May 3, 2011

(54) DEFECTIVE BIT SCHEME FOR MULTI-LAYER INTEGRATED MEMORY DEVICE

(75) Inventors: Hai Li, Eden Prairie, MN (US); Yiran Chen, Eden Prairie, MN (US); Dadi Setiadi, Edina, MN (US); Harry Hongyue Liu, Maple Grove, MN (US); Brian Lee, Boston, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 119 days.

(21) Appl. No.: 12/502,194

(22) Filed: Jul. 13, 2009

(65) Prior Publication Data
US 2011/0007588 A1 Jan. 13, 2011

(51) Int. Cl.
*G11C 29/00* (2006.01)
(52) U.S. Cl. ....... 365/200; 365/180; 365/49.1; 365/130; 365/201
(58) Field of Classification Search .................. 365/200, 365/180, 49.1, 130, 201
See application file for complete search history.

(56) References Cited

U.S. PATENT DOCUMENTS

| 5,610,865 | A | 3/1997 | Shin et al. |
| 6,426,902 | B1 | 7/2002 | Lee et al. |
| 6,928,377 | B2 | 8/2005 | Eustis et al. |
| 7,266,036 | B2 | 9/2007 | Hayashi et al. |
| 2002/0095617 | A1 | 7/2002 | Norman |
| 2010/0333056 | A1* | 12/2010 | Emma et al. .................. 716/119 |

* cited by examiner

*Primary Examiner* — Thong Q Le
(74) *Attorney, Agent, or Firm* — Fellers, Snider et al.

(57) ABSTRACT

Various embodiments of the present invention are generally directed to an apparatus and associated method for handling defective bits in a multi-layer integrated memory device. In accordance with some embodiments, the multi-layer integrated memory device is formed from a plurality of vertically stacked semiconductor layers each having a number of storage sub-arrays and redundant sub-arrays. Each semiconductor layer is tested to determine a defect rate for each array, and a defective portion of a first semiconductor layer having a relatively higher defect rate is stored to a redundant sub-array of a second semiconductor layer having a relatively lower defect rate.

20 Claims, 6 Drawing Sheets

DEFECTIVE BIT SCHEME FOR MULTI-LAYER INTEGRATED MEMORY DEVICE

BACKGROUND

Multi-layer three-dimensional (3D) integrated memory devices have been recently proposed as a way to achieve high density storage in a relatively small footprint. Such devices can be formed by stacking separate layers of memory cells in a vertical direction to integrate the memory cells into a single memory space.

While operable, a limitation with such multi-layer memory devices relates to overall process yields in terms of the percentage of non-defective chips in a given manufacturing process. The overall yield can generally be determined by multiplying the yield percentage of each layer in the stack. The compound chip yield in a given process may tend to decrease significantly as the number of stacked layers increase. Factors that can negatively impact process yield include defects in a single layer, misalignments between adjacent layers, and mechanical defects incurred during the attachment process.

Redundant cells (spares) are often utilized to address defects at the layer level. When one or more defective cells (bits) in a layer are identified during testing, a memory decoder can deallocate the defective bits and allocate new replacement bits from the redundant cell pool on that layer.

Defects in multi-layer memory devices may have a significant "localization effect." If a particular layer has a relatively high defect rate (e.g., high number of defective cells), it is likely that the redundant cells on the layer may also have a relatively large number of defects. Providing sufficient redundant cells to handle the worst-case defect rates on each layer may reduce the overall data capacity of the array, and may unnecessarily limit overall storage capacity since some layers may have relatively few defects. Nevertheless, in the past an entire layer, or even an entire multi-layer chip, may have been discarded from the manufacturing process because a single layer within the chip had too many defects to be accommodated by the available spare cells on that layer.

SUMMARY

Various embodiments of the present invention are generally directed to an apparatus and associated method for handling defective cells in a multi-layer integrated memory device.

In accordance with some embodiments, a multi-layer integrated memory device is formed by vertically stacking a plurality of semiconductor layers. Each semiconductor layer has an associated storage sub-array and redundant sub-array, and is tested to determine a defect rate for that layer. A defective portion of a first semiconductor layer with a relatively higher defect rate is thereafter allocated to the redundant sub-array of a second semiconductor layer having a relatively lower defect rate.

These and various other features and advantages which characterize the various embodiments of the present invention can be understood in view of the following detailed discussion in view of the accompanying drawings.

DETAILED DESCRIPTION

The present disclosure generally relates to the handling of defective cells (bits) in a multi-layer integrated memory device, and in particular to methods and architectures that may be used to improve the effective yield of such devices.

Often, the total yield of a multi-layer integrated memory device can be limited as tolerances reach the nanometer range. High density memory at such precise tolerances can have defects that can hinder the efficiency of the memory. In the past, some prior art memory arrays have utilized complex redundancy schemes that require burdensome processing time with high physical overhead requirements.

Moreover, vertically stacked layers of memory cells can be limited with respect to total yield due in part to the different layers exhibiting different amounts of defects. As a result, every layer of the memory space is often designed to be able to accommodate a large number of defects with redundant cells. Such high numbers of redundant cells commonly result in wasted portions of usable memory throughout the memory space.

Accordingly, a defective bit scheme and methodology is disclosed herein that provides a plurality of semiconductor layers that are vertically arranged to form a multi-layer integrated memory device. Each of the semiconductor layers has a storage sub-array and a redundant sub-array. Each semiconductor layer is tested to determine a defect rate so that a defective portion of a sub-array of a first semiconductor layer can be stored to a redundant sub-array of a second semiconductor layer with a lower defect rate.

In some embodiments, the defective bits in the memory space can be accommodated by using redundant cells from the semiconductor layer with the least incidence of defects, thereby eliminating the wasteful allocation of redundant memory sectors throughout the memory space.

Figure 1:
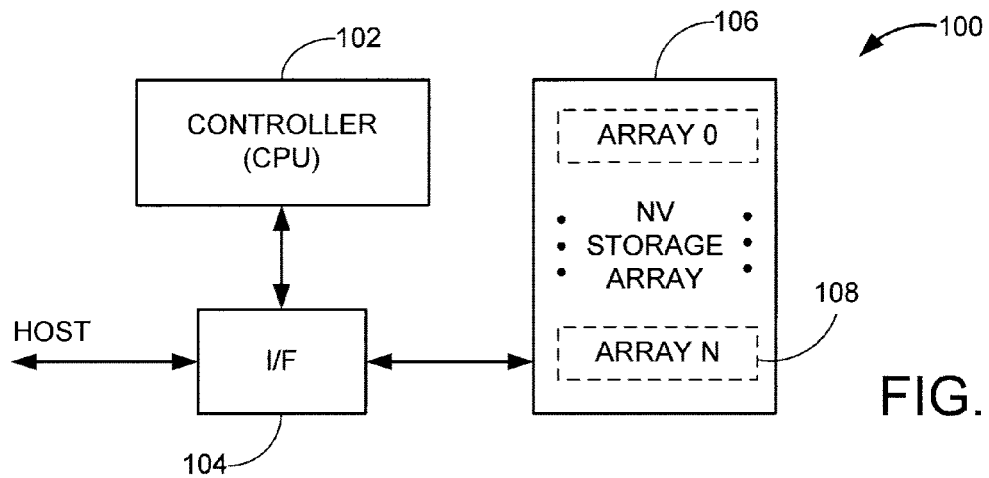
FIG. 1 provides a functional block representation of a data storage device in accordance with various embodiments of the present invention.

Turning to the drawings, FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of memory arrays 108 (denoted Array 0-N), although it will be appreciated that a single array can be utilized as desired. Each array 108 comprises a block of semiconductor memory of selected storage capacity. Communications between the controller 102 and the memory space 106 are coordinated via the I/F 104.

It can be appreciated that the memory space 106 can be configured in various different ways with a variety of write and read circuitry. One such configuration can be as an array of non-volatile memory cells 110 configured on a number of semiconductor layers 112 and arranged as storage sub-arrays 114 and redundant sub-arrays 116, as displayed in FIG. 2. A plurality of storage sub-arrays 114 can be oriented either physically or logically to correspond to a particular row 118 and column 120 of memory. As such, accessing a particular row and column in which a selected sector of memory is oriented can facilitate access to or from data stored in the selected sector.

Figure 2:
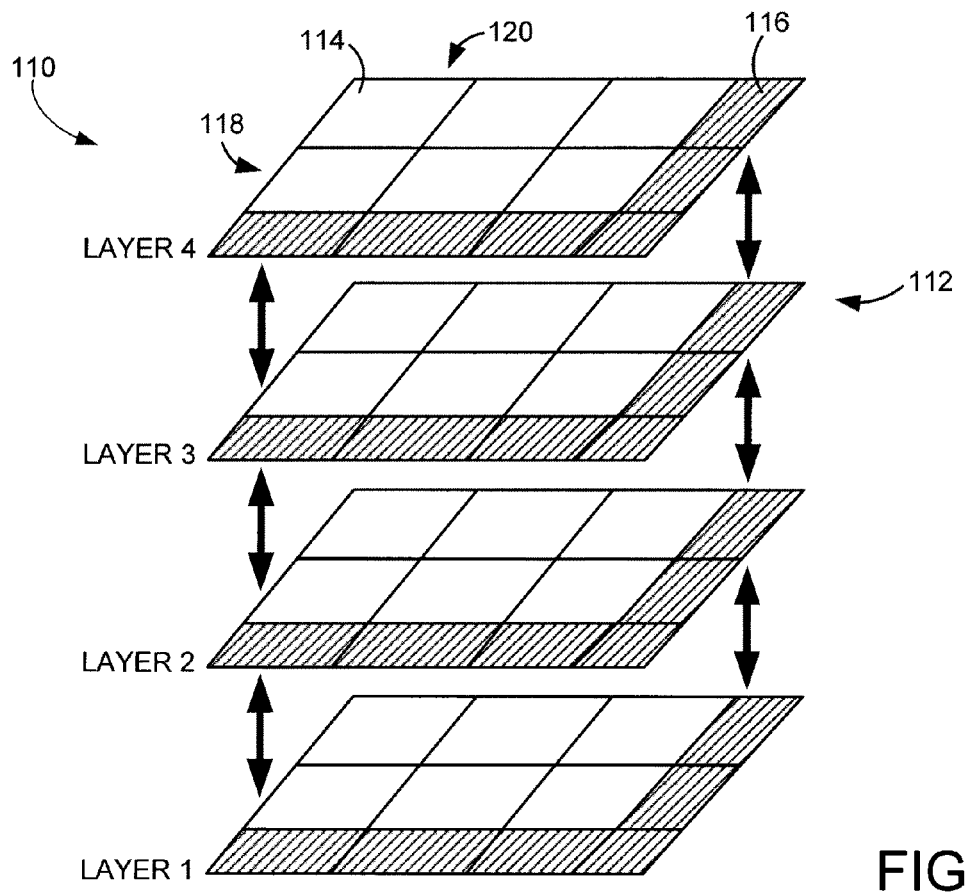
FIG. 2 sets forth a generalized representation of a non-volatile memory array of the exemplary device of FIG. 1.

It should be noted that numerous different configurations of memory cells are possible and the orientation shown in FIG. 2 is not limiting. Furthermore, the size of a memory array 110 is not restricted and can be constructed with as many semiconductor layers, sub-arrays, rows, and columns as desired.

Figure 3:
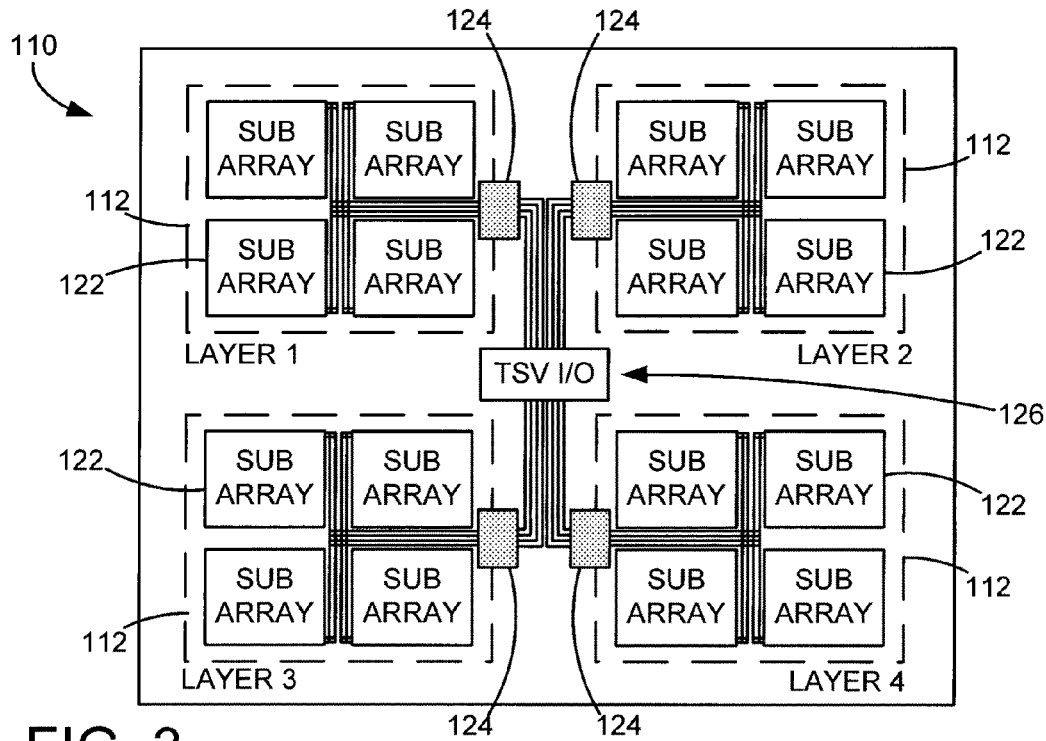
FIG. 3 generally illustrates an exemplary representation of the non-volatile memory array of FIG. 2.

FIG. 3 generally illustrates an exemplary representation of the non-volatile array of memory cells 110 of FIG. 2. As shown, each semiconductor layer 112 can be configured with a plurality of sub-arrays 122 that are connected to a layer arbiter 124 which in turn is connected to a through silicon via input output (TSV I/O) component 126. It should be noted that the configurations of the semiconductor layers 112 are not limited to the orientations shown and can include various components, such as the redundant sub-arrays 116 of FIG. 2.

In some embodiments, the various layer arbiters 124 and TSV I/O component 126 can process a hierarchical decoding scheme that allows for efficient reading and writing of data despite the presence of defective memory cells. Such a hierarchical decoding scheme can allow each layer arbiter 124 to control the priority in which data is transferred to/from the TSV I/O 126. Further, the hierarchical decoding scheme can include pre-decoding circuitry and/or local decoding circuitry that correspond to each sub-array 122. However, such hierarchical decoding scheme is not required to correct for defective bits in accordance with the various embodiments of the present invention disclosed herein.

Each sub-array 122 and layer 112 are tested individually or in combination to determine the presence and frequency of defective bits. This testing can be carried out in a number of ways, including through the use of built-in test capabilities of the array or controller during device field operation. This testing can also be performed using specially configured test equipment during array manufacturing.

When a defective cell is identified, the TSV I/O 126 as well as the layer arbiters 124 can direct host access away from the defective bits to a redundant bit that may or may not be located on the same semiconductor layer 112. That is, each semiconductor layer 112 can have a redundant sub-array that can handle intra-layer defective bits. However, the TSV I/O 126 and layer arbiters 124 can also utilize the redundant sub-arrays of various layers to conduct inter-layer allocation of defective bits.

As an example, a host can input an address of a defective bit and the TSV I/O 126 in combination with the layer arbiters 124 can seamlessly translate the request to the redundant address and conduct the desired operations on the redundant bit in the place of the defective bit without notice to the host. While the redundant bits can be spatially adjacent to the defective bits, the present disclosure allows for spatial separation of redundant bits by locating them on the semiconductor layer with the lowest frequency of defective bits. As such, the productivity and capacity of a vertical stack of semiconductor layers can be greatly improved by decreasing allocating space on the least defective layer for repair of defective bits.

Figure 4:
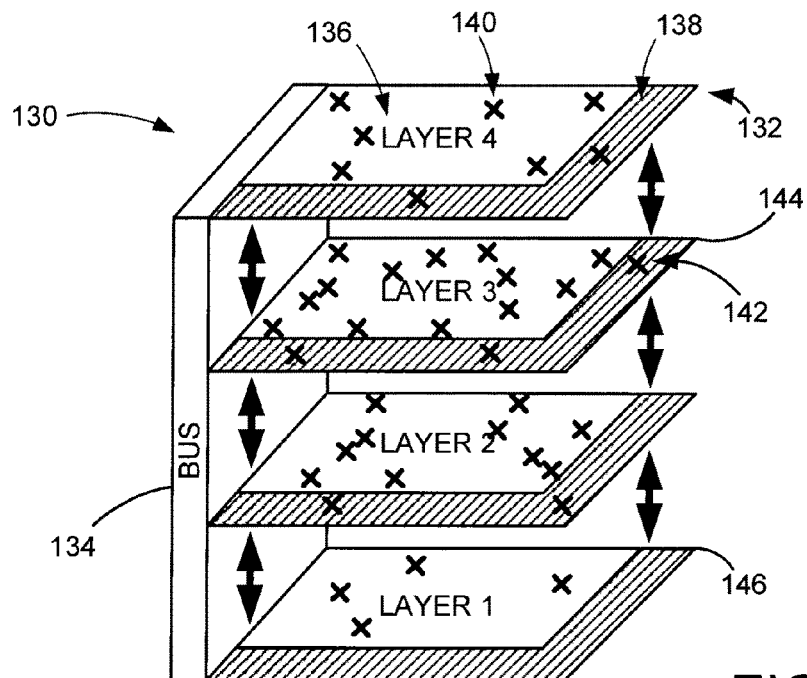
FIG. 4 depicts an exemplary array of memory cells constructed in accordance with various embodiments of the present invention.

FIG. 4 generally depicts an exemplary construction of a vertical stack of memory cells 130 in accordance with various embodiments of the present invention. A plurality of semiconductor layers 132 are vertically stacked while communicating with a common bus 134, such as the TSV I/O 126 of FIG. 3. Each semiconductor layer 132 is configured into a storage sub-array 136 and redundant sub-array 138. In response to any number of manufacturing and operational operations, defective locations of memory such as defective storage bits 140 and defective redundant bits 142 can be present. While the number and size of the defective bits is not limited, it should be noted that the size of the redundant sub-arrays 138 for each semiconductor layer 132 can be configured to be equal.

It can be appreciated that defects caused by manufacturing operations often are not isolated to a certain sector of a semiconductor layer, such as the storage sub-array 136 or the redundant sub-array 138. Therefore, the presence of numerous defective bits in either the storage sub-array 136 or the redundant sub-array 138 of a particular semiconductor layer 132 may correspond to a high volume of defective bits throughout the semiconductor layer 132. In response, a sub-array of each semiconductor layer 132 can be tested for the presence of defective bits and a defect error rate can be computed. However, every sub-array of each semiconductor layer 132 can alternatively be tested to acquire a more precise defect error rate for every semiconductor layer.

For instance, testing of the vertical stack of memory cells 130 having the various indicated defects would result in a high error rate for "Layer 3" 144 and a low error rate for "Layer 1" 146 regardless of the sequence or area of each semiconductor layer 132 that was evaluated. The defective storage bits of "Layer 3" 144 could be reallocated to the redundant sub-array 138 of "Layer 1" 146 to better ensure the allocated bit is not itself defective.

Figure 5:
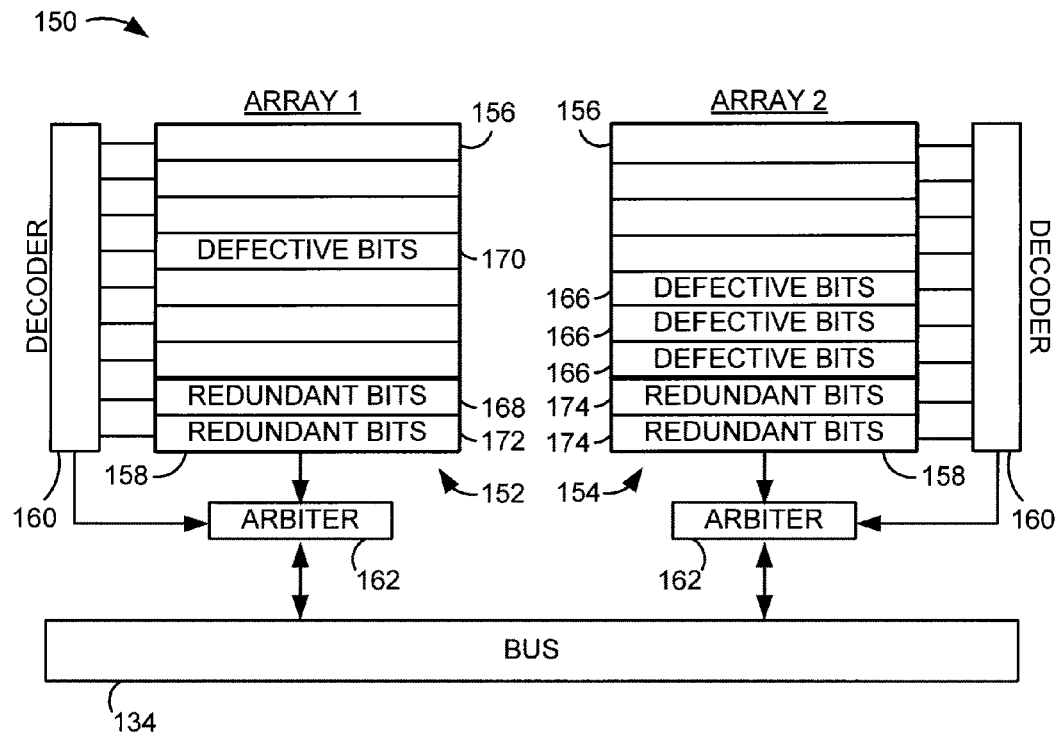
FIG. 5 generally illustrates an exemplary operation of an array of non-volatile memory in accordance with various embodiments of the present invention.

In FIG. 5, an exemplary operation of a vertical stack of memory cells 150 is shown. In various embodiments, an array 152 of a first semiconductor layer is paired with an array 154 of a second semiconductor layer so that a host request to access a portion of either array will access corresponding portions of both arrays 152 and 154. As displayed, each array 152 and 154 can be configured with a storage sub-array 156 and a redundant sub-array 158. If a portion of either array 152 or 154 is defective, the decoder 160 and arbiters 162 can translate and redirect the host request to the allocated portion of the redundant sub-array 158 of either array 152 or 154 to a bus 164.

Even though the arrays 152 and 154 are located on different semiconductor layers, the defective bits 166 of the second layer array 154 can be allocated as redundant bits 168 of the redundant sub-array 158 of the first layer array 152. Conversely, the defective bits 170 of the first layer array 152 can be allocated to the redundant bits 172 of the same array 152.

Furthermore, when there are more defective bits than redundant bits on the same semiconductor layer, the paired array can be utilized as an overflow region for defective bit allocation. As such, the pairing of arrays on two different semiconductor layers allows for redundant repair of defective bits while limiting the amount of memory space a processor would have to search for a requested defective bit. It can be appreciated that such flexibility in repairing defective bits allows a small amount redundant bits to accommodate a large number of defects across a vertically stacked memory space.

Figure 6:
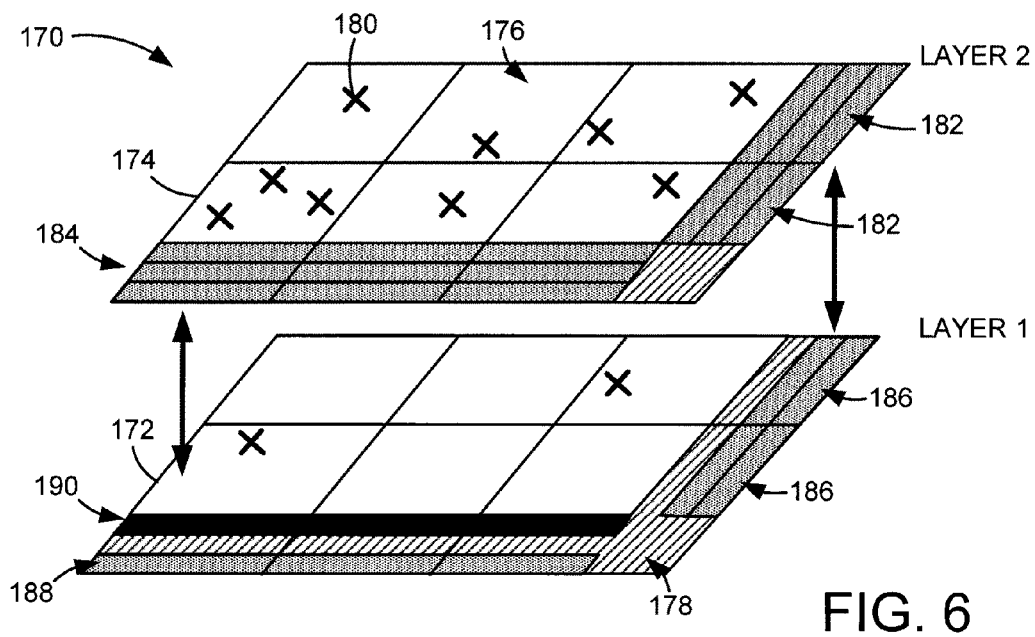
FIG. 6 displays an exemplary operation of an array of memory in accordance with various embodiments of the present invention.

FIG. 6 displays another exemplary representation of the operation of a vertical stack of memory cells 170. A first semiconductor layer of memory cells 172 is vertically stacked with a second semiconductor layer of memory cells 174. While the semiconductor layers 172 and 174 are shown having multiple segmented storage sub-arrays 176 and redundant sub-arrays 178, such configuration is not required or limiting to the present invention.

In some embodiments, the first semiconductor layer 172 is identified after testing as having the lowest defect rate of the available semiconductor layers. As the amount of defective bits 180 overwhelm the capacity of the redundant sub-array 178 of the second semiconductor layer 172 with allocated columns 182 and rows 184, redundant columns 186 and rows 188 of the redundant sub-array of the first semiconductor layer 172 are allocated. Such allocation does not necessarily prevent the allocation of defective bits with the same semiconductor layer, as illustrated by the allocated row 190 that corresponds to the defective bits of the first semiconductor layer 172.

It should be noted that the presence of a defective bit can result in the deallocation of an entire row or column of bits of memory. That is, when a defective bit is located, the row or column corresponding to the defective bit can be deallocated and access redirected to a designated row of column in a redundant sub-array 178. The timing and allocation of rows and columns of memory is not limited as redundant bits can be allocated before the redundant sub-array of the particular semiconductor layer is filled to capacity.

Figure 7A:
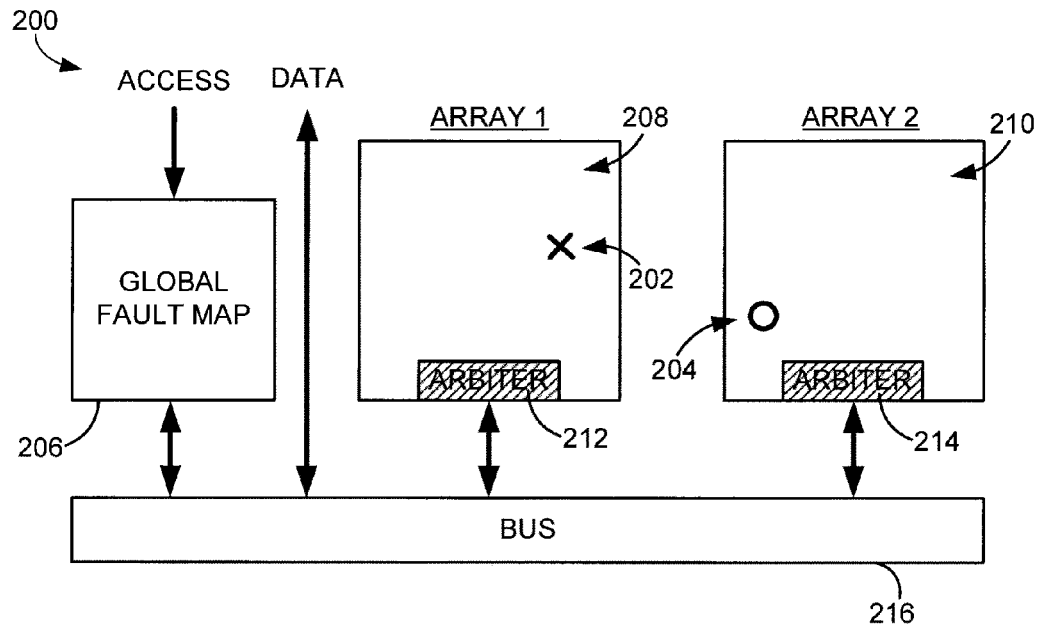
FIGS. 7A-7B generally illustrates an exemplary operation of a data storage device in accordance with various embodiments of the present invention.
Figure 7B:
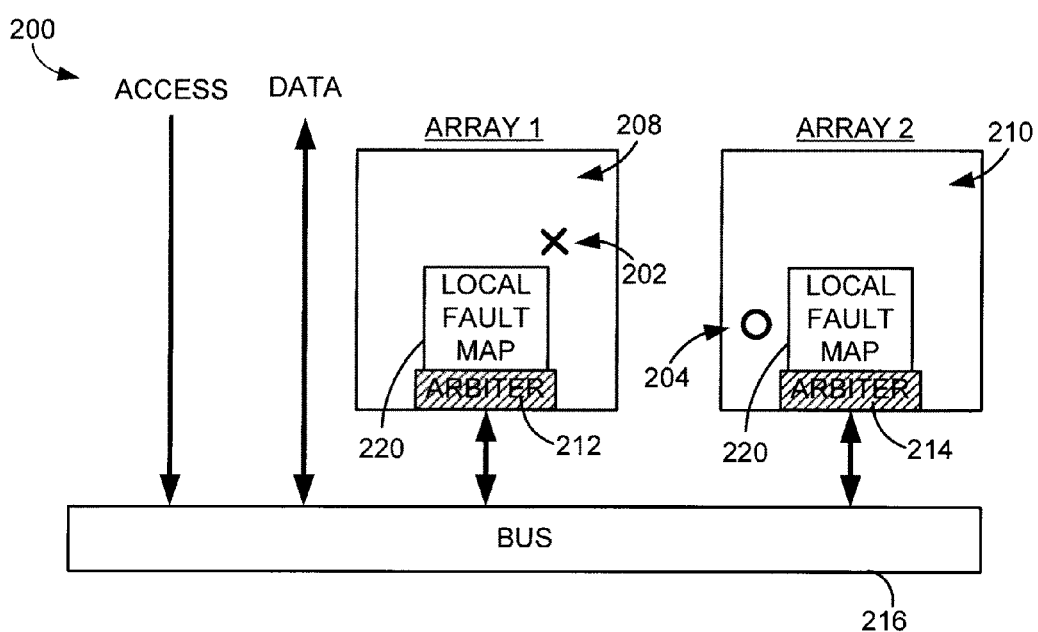

FIGS. 7A-7B generally illustrates exemplary operations of a data storage device 200 in accordance with various embodiments of the present invention. As defective bits 202 are located and corrected with allocation of a redundant bit 204, a global fault map 206 can be created that efficiently supplies information about defective bits and the corresponding allocation of redundant bits.

In operation, a defective bit 202 in a first array 208 can be allocated to the redundant sub-array of a second array 210 by first and second arbiters 212 and 214. Further, a host access request to the original address of the defective bit 204 will be evaluated in the global fault map 206 and the requested address will be translated into the address of the redundant bit 204 so that data can be transferred to the host from the redundant bit location via the bus 216.

Alternatively, a local fault map 220 can be used in each array 208 and 210 to store pertinent information about defective bits 202 and allocated redundant bits 204, as displayed in FIG. 7B. While a local fault map 220 is shown for each array 208 and 210, such orientation is not limiting and local fault maps of any size can be configured throughout the data storage device 200. For example, a local fault map 220 can be constructed and operated in each sub-array of each array.

It should be noted that the depiction of the first and second arrays 208 and 210 is merely exemplary as the various orientations, such as on different semiconductor layers, can be facilitated without deterring from the spirit of the present invention. It should further be noted that the structure of the global and local fault maps 206 and 220 is not limited. As such, the fault maps can be configured in various manners including, but not limited to, content addressable memory (CAM) and forward pointing lists.

Figure 8:
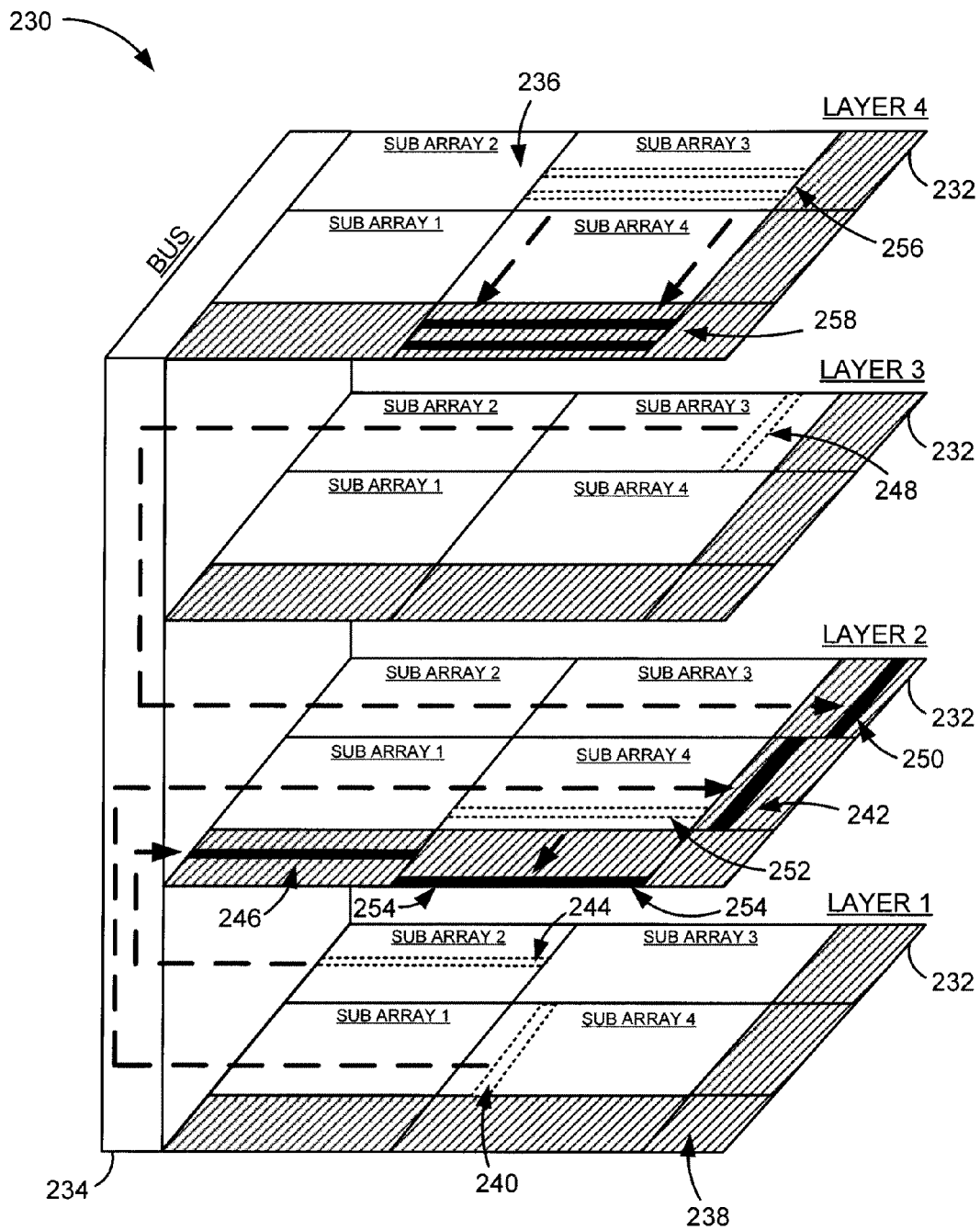
FIG. 8 displays an exemplary operation of a plurality of semiconductor layers in accordance with various embodiments of the present invention.

FIG. 8 generally displays various exemplary operations of a plurality of semiconductor layers 230 in accordance with various embodiments of the present invention. As shown, each semiconductor layer 232 is vertically stacked and connected to a bus 234, such as the TSV I/O 126 of FIG. 3. Furthermore, each semiconductor layer is arranged with a number of storage sub-arrays 236 and redundant sub-arrays 238. As the various semiconductor layers 232 are tested for the presence and frequency of defective bits, "Layer 2" is identified as having the lowest defect rate. Hence, the defective bits of the various semiconductor layers 232 are allocated to redundant bits in predetermined redundant sub-arrays 238.

In various exemplary operations, a column of bits 240 from a sub-array of the first semiconductor layer is allocated to a redundant column of bits 242 on the second semiconductor layer. Similarly, a row of bits 244 are allocated from a storage sub-array of the first semiconductor layer to a row of redundant bits 246 on the second semiconductor layer. In yet another allocation of defective bits to the second semiconductor layer, a column of bits 248 from the third semiconductor layer is allocated to a column of bits 250 in the second semiconductor layer. However, it should be noted that while the various rows and columns of bits are being allocated, the entire column or row is not necessarily defective.

In addition, any defective bits of the second semiconductor layer can be allocated as a row 252 from a storage sub-array on the second semiconductor layer to a row 254 in a redundant sub-array of the same semiconductor layer. While any number of semiconductor layers can have a defective bit allocated to the layer with the lowest defect rate, such allocation is not required, as shown in the fourth semiconductor layer. Several rows of defective bits 256 are allocated to rows 258 of the redundant sub-array in the same semiconductor layer.

In sum, various operations conducted on the plurality of semiconductor layers 230 can allocate redundant bits to replace defective bits on the same semiconductor layer. Moreover, a row or column of bits can be allocated from a defective location to a portion of a redundant sub-array on the semiconductor layer that has the lowest defect rate. As a result, small redundant sub-arrays can be effectively used to correct for defective bits and the size of the storage sub-arrays for each semiconductor layer is maximized.

Figure 9:
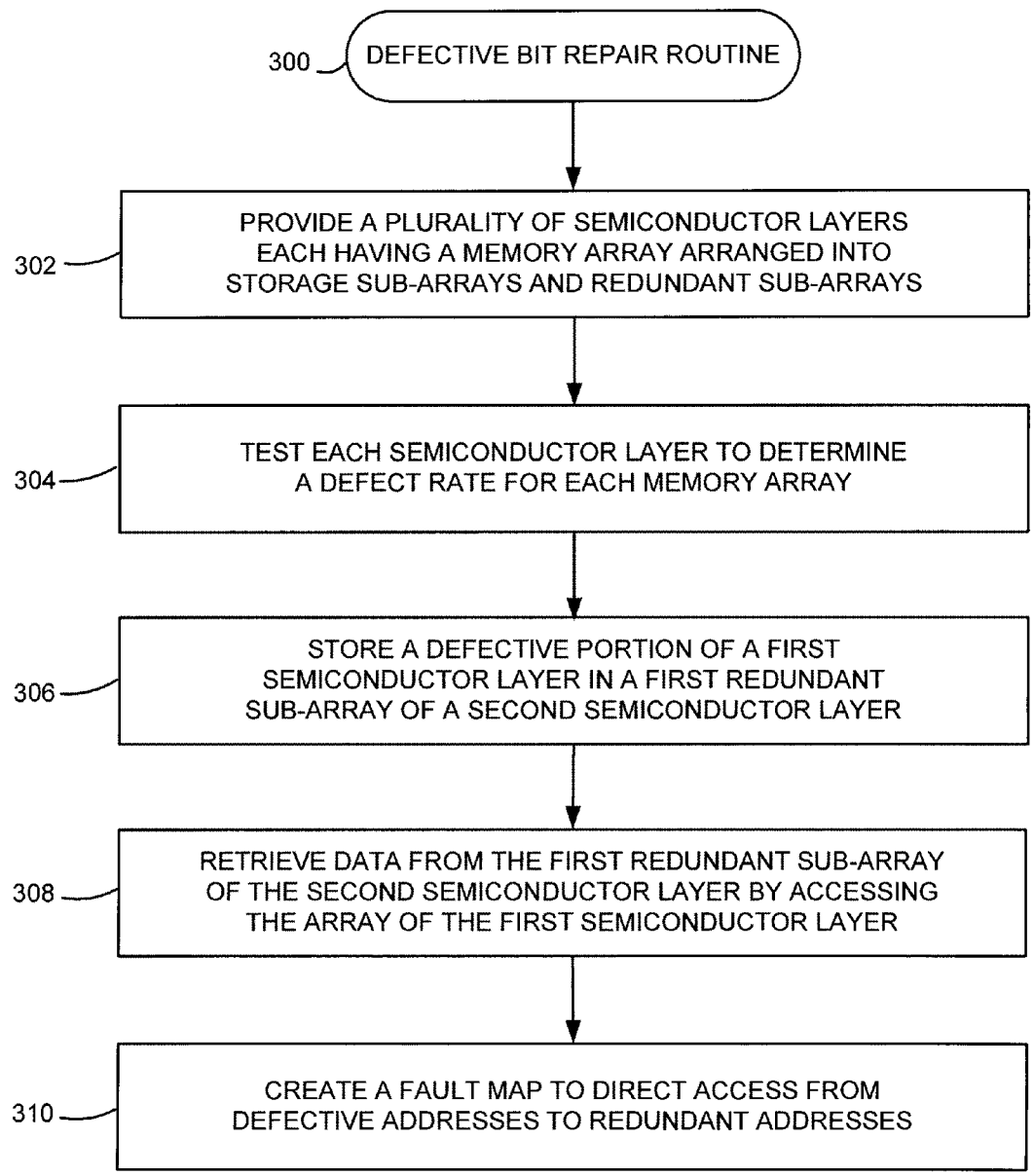
FIG. 9 provides a flowchart of an exemplary DEFECTIVE BIT REPAIR routine performed in accordance with various embodiments of the present invention.

FIG. 9 provides a flow chart for a DEFECTIVE BIT REPAIR ROUTINE 300, generally illustrative of steps carried out in accordance with various embodiments of the present invention. At step 302, a plurality of semiconductor layers that each have a memory array arranged into storage sub-arrays and redundant sub-arrays. Each semiconductor layer is tested in step 304 for the presence and frequency of defective bits to determine a defect rate for each memory array. In some embodiments, the defect rate is determined in relation to paired storage or redundant sub-arrays.

A defective portion of a first semiconductor layer is stored in a first redundant sub-array of a second semiconductor layer in step 306. Various embodiments have a portion of a first storage sub-array stored in the first redundant sub-array of the second semiconductor layer. In other embodiments, a row or column of bits which contains both valid and defective bits is stored in the first redundant sub-array of the second semiconductor layer. Step 308 further retrieves data from the first redundant sub-array of the second semiconductor layer by accessing the array of the first semiconductor layer. That is, the address provided by a host to the first array of the first semiconductor layer is translated and redirected to the allocated bits of the first redundant sub-array of the second semiconductor layer so that data can be outputted to the host.

Finally in step 310, a fault map is created to direct access from defective bits to corresponding allocated redundant bits. As discussed above, the fault map can be various memory structures including a CAM or a forward pointing list to efficiently translate defective addresses into corresponding allocated addresses.

It should be noted that the steps of the defective bit repair routine 300 are not limited. That is, the various steps can be omitted, moved, or modified without deterring from the spirit of the present invention. Similarly, the characterizations of a "defective bit" are not limited to a certain kinds of inoperability and can correspond to any user defined function. For example, a bit can be deemed defective if the sense margin does not fall within defined tolerances.

As can be appreciated by one skilled in the art, the various embodiments illustrated herein provide advantages in both data storage device efficiency and capacity due to the elimination of unused bit repair sectors. The allocation of redundant bits to replace defective bits across different semiconductor layers allows for more precise data access operations. Moreover, data access accuracy can be greatly improved by reducing the complexity associated with using a redundancy schemes for each respective semiconductor layer in a vertical stack of semiconductor layers. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
    forming a multi-layer integrated memory device by vertically stacking a plurality of semiconductor layers each having an associated storage sub-array and redundant sub-array;
    testing each semiconductor layer to determine a defect rate for said layer; and
    allocating a defective portion of a first semiconductor layer with a relatively higher defect rate to the redundant sub-array of a second semiconductor layer having a relatively lower defect rate.

2. The method of claim 1, further comprising retrieving data from the redundant sub-array of the second semiconductor layer by accessing the array of the first semiconductor layer.

3. The method of claim 2, wherein a global fault map redirects the retrieval of data from the array of the first semiconductor layer to the redundant sub-array of the second semiconductor layer.

4. The method of claim 2, wherein a first local fault map corresponding to the first semiconductor layer and a second local fault map corresponding to the second semiconductor layer each redirect the retrieval of data from the array of the first semiconductor layer to the redundant sub-array of the second semiconductor layer.

5. The method of claim 2, wherein values from a sub-array of the first semiconductor layer is concurrently retrieved from the redundant sub-array of the second semiconductor layer.

6. The method of claim 1, wherein the defective portion of the first semiconductor layer is located in the storage sub-array of the first semiconductor layer.

7. The method of claim 6, wherein data from a defective portion of a second storage sub-array of the first semiconductor layer are stored in a redundant sub-array of the first semiconductor layer.

8. The method of claim 1, wherein data is stored in the redundant sub-array of the second semiconductor layer after a redundant sub-array of the first semiconductor layer is full.

9. The method of claim 1, wherein a first sub-array of the first semiconductor layer is paired to a first sub-array of the second semiconductor layer.

10. The method of claim 1, wherein a content addressable memory (CAM) contains a fault map that translates defective addresses to redundant addresses that corresponds to a non-defective second location.

11. The method of claim 1, wherein a row of memory cells in the first semiconductor layer that contains both defective and non-defective memory cells is stored as a row of memory cells in the redundant sub-array of the second semiconductor layer.

12. An apparatus comprising a multi-layer integrated memory device formed from a vertical stack of a plurality of semiconductor layers each having a plurality of memory cells arranged in a number of sub-arrays and redundant sub-arrays, wherein each semiconductor layer is tested to determine a defect rate for each sub-array, and a defective portion of a first semiconductor layer is stored in a redundant sub-array of a second semiconductor layer having a lowest defect rate of all said layers.

13. The apparatus of claim 12, wherein each semiconductor layer has an equal number of sub-arrays and redundant sub-arrays.

14. The apparatus of claim 12, wherein the first semiconductor layer has a first number of cells in the associated number of redundant sub-arrays and the second semiconductor layer has a different second number of cells in the associated number of redundant sub-arrays.

15. The apparatus of claim 12, wherein the defect rate corresponds to the number of unusable memory cells in the sub-arrays and redundant sub-arrays of each semiconductor layer.

16. The apparatus of claim 12, wherein a global fault map translates an original address that accesses a defective first location into a redundant address that accesses a non-defective second location.

17. The apparatus of claim 12, wherein defective data from a first and second portion of a first sub-array of a third semiconductor layer are stored in a second and third redundant sub-array of the second semiconductor layer.

18. The apparatus of claim 17, wherein the first portion is a row of memory cells and the second portion is a column of memory cells.

19. The apparatus of claim 12, wherein a content addressable memory (CAM) is used to redirect retrieval of data from the array of the first semiconductor layer to the first redundant sub-array of the second semiconductor layer.

20. The apparatus of claim 12, wherein all available redundant sub-arrays of the first semiconductor layer are filled before the defective portions are stored in the second semiconductor layer.

* * * * *